(12) United States Patent
Chen et al.

(10) Patent No.: US 11,460,528 B2
(45) Date of Patent: Oct. 4, 2022

(54) MRI RECONSTRUCTION WITH IMAGE DOMAIN OPTIMIZATION

(71) Applicant: Shanghai United Imaging Intelligence Co., LTD., Shanghai (CN)

(72) Inventors: Zhang Chen, Cambridge, MA (US); Shanhui Sun, Cambridge, MA (US); Xiao Chen, Cambridge, MA (US); Terrence Chen, Cambridge, MA (US)

(73) Assignee: Shanghai United Imaging Intelligence Co., LTD., Shanghai (CN)

( * ) Notice: Subject to any disclaimer, the term of this patent is extended or adjusted under 35 U.S.C. 154(b) by 58 days.

(21) Appl. No.: 16/936,571

(22) Filed: Jul. 23, 2020

(65) Prior Publication Data

US 2022/0026514 A1    Jan. 27, 2022

(51) Int. Cl.
*G01R 33/56* (2006.01)
*G06N 3/08* (2006.01)

(52) U.S. Cl.
CPC ........... *G01R 33/5608* (2013.01); *G06N 3/08* (2013.01)

(58) Field of Classification Search
CPC .............................. G01R 33/5608; G06N 3/08
See application file for complete search history.

(56) References Cited

U.S. PATENT DOCUMENTS

| 11,199,602 B2 * | 12/2021 | Chen ........................ G06N 3/08 |
| 2010/0239143 A1 * | 9/2010 | Griswold ........... G01R 33/5611 382/128 |

\* cited by examiner

*Primary Examiner* — Susan S Lee
(74) *Attorney, Agent, or Firm* — Ziegler IP Law Group, LLC

(57) ABSTRACT

An apparatus for magnetic resonance imaging (MRI) image reconstruction is provided. The apparatus accesses a training set of MRI data for training. The training set can include paired fully sampled data or unpaired fully sampled data. Undersampled MRI data is optimized in an MRI data optimization module to generate reconstructed MRI data. The apparatus builds a discriminative model using the training set and the reconstructed MRI data. During inference, the parameters of the discriminator model are fixed and the discriminator model is used to classify an output of the MRI data optimization model as the reconstructed MRI image.

20 Claims, 5 Drawing Sheets

MRI RECONSTRUCTION WITH IMAGE DOMAIN OPTIMIZATION

TECHNICAL FIELD

The aspects of the present disclosure relate generally to image reconstruction and more particularly to Magnetic Resonance Imaging (MRI) data reconstruction based on a machine learning network.

BACKGROUND

Magnetic Resonance Imaging (MRI) is one of the major diagnostic imaging modalities with noninvasive and non-ionizing radiation nature. However, relatively low imaging speed can limit the clinical application of MRI. The physical limitations of the MRI device and long data acquisition procedures can lead to a slow image acquisition process, which increases cost, worsens the patient experience and can hinder the application of MRI in time-sensitive examinations.

Image reconstruction is a critical step in the clinical application of MRI. Typically, to accelerate the image acquisition time, the k-space data is only partially obtained by random sampling during the data acquisition. Rather than acquiring the full data, the number of lines to be filled in the k-space is reduced. This partially acquired data is commonly referred to as "undersampled" k-space data or "undersampling." However, undersampled k-spaced data can lead to issues, such as for example aliasing artifacts, which degrades image quality and prohibits the usage in clinical diagnosis. Therefore, recovering the fully sampled image from the undersampled data in a fast way is important for MRI image reconstruction.

Compressed sensing (CS) based approaches have been applied to MRI reconstruction in clinical practice to reconstruct data from highly undersampled measurements. In deep learning, the regularization function of the compressed sensing approach can be replaced by a neural network and learned from data. However, the optimization is performed in the parametric space of the neural network instead of the image space and it is not possible to uniquely recover the fully sampled image given the partial image data we observe.

Accordingly, it would be desirable to be able to provide an MRI image reconstruction process that addresses at least some of the problems identified above.

SUMMARY

The aspects of the disclosed embodiments are directed to an apparatus configured to reconstruct an MRI image by optimizing the image directly. This objective is solved by the subject matter of the independent claims. Further advantageous modifications can be found in the dependent claims.

According to a first aspect the above and further objectives and advantages are obtained by an apparatus. In one embodiment, the apparatus is configured to reconstruct a magnetic resonance imaging (MRI) image. The apparatus includes a processor and a memory, the memory storing executable instructions. The executable instructions, in response to execution by the processor, cause the apparatus to access a training set of MRI data and reconstructed MRI data and build a discriminative model using the training set of MRI data and the reconstructed MRI data. The discriminative model is trained to distinguish between fully sampled MRI data and optimized or reconstructed MRI data. The optimization can be in the image domain or the k-space. During inference, the discriminator model will classify the optimized MRI data as the reconstructed MRI image or fully sampled MRI data. The aspects of the disclosed embodiments are configured to update the optimized or reconstructed MRI data directly and train the discriminator such that the reconstructed MRI data is not distinguishable from the fully sampled MRI data.

In a possible implementation form of the apparatus, the MRI data optimization model is configured to optimize undersampled MRI data to generate the reconstructed MRI image or fully sampled MRI data.

In a possible implementation form of the apparatus, the training set of MRI data includes paired fully sampled MRI data or unpaired MRI data.

In a possible implementation form the MRI data can be in two formats, image and k-space. The optimization can be in the image domain or the k-space domain. The k-space can be optimized and/or the discriminator can classify if the k-space is a subsampled or fully sampled k-space.

In a possible implementation form of the apparatus, the apparatus is further configured to receive the undersampled MRI data from an MRI apparatus, optimize parameters of the undersampled MRI data in the MRI data optimization model and generate the reconstructed MRI data.

In a possible implementation form of the apparatus, during training, fully sampled MRI data and reconstructed MRI data will be fed or inputted into the discriminator. The discriminator will classify the inputted MRI data as reconstructed MRI data or fully sampled MRI data. The aspects of the disclosed embodiments are configured to update the reconstructed MRI data and train the discriminator such that the reconstructed MRI data is not distinguishable from the fully sampled MRI data. There are two classes in this classification task: reconstructed image class versus fully sampled image class. If the discriminator correctly classifies the reconstructed MRI data as reconstructed MRI data, this indicates that the updated or reconstructed MRI data is not good enough and needs to be improved. If the discriminator incorrectly classifies the reconstructed MRI data as fully sampled MRI data, which is a desired result, this indicates that the updated MRI data is good enough. The final goal is to cause the system to generate reconstructed MRI data that the discriminator will classify as fully sampled MRI data.

In a possible implementation form of the apparatus, during training, fully sampled MRI data and reconstructed MRI data will be fed into the discriminator. The discriminator will be optimized to accurately classify the fully sampled MRI data and reconstructed MRI data. The fully sampled MRI data are defined as the class with the large probability and the reconstructed MRI data is the class with the small probability. For example, if the fully sampled MRI data is defined as the positive class and reconstructed MRI data as the negative class, the large probability from the discriminator indicates the MRI data is highly likely to be fully sampled MRI data. A small probability indicates the MRI data is not likely to be fully sampled MRI data, but rather, is highly likely to be reconstructed MRI data.

In a possible implementation form of the apparatus, during training, the undersampled MRI data will be directly optimized in order to "fool" the discriminator such that the reconstructed MRI data cannot be classified or distinguished from the fully sampled MRI data by the discriminator.

In a possible implementation form of the apparatus, the undersampled MRI data is directly optimized by changing values in the image or k-space.

In a possible implementation form of the apparatus, during training, the discriminator will learn the prior distribution of the fully sampled MRI data and provide guidance for MRI data domain optimization. After training, the reconstructed MRI data cannot be distinguished from the fully sampled MRI data by the discriminator. In this manner, the reconstructed MRI data is in the distribution of the fully sampled MRI data.

In a possible implementation form of the apparatus, during training, data fidelity or consistency can be enforced by minimizing the distance between the reconstructed MRI data with some measurement operation and the observed k-space. The distance can be defined as L2, L1 or some other distance metric.

In a possible implementation form of the apparatus, during training, the fully sampled MRI data is paired with the undersampled MRI data.

In a possible implementation form of the apparatus, during training the fully sampled MRI data is not paired with the undersampled MRI data. The model can be trained in a semi-supervised fashion.

In a possible implementation form of the apparatus, DICOM images are used to train the discriminator.

In a possible implementation form of the apparatus, during training, the initial reconstructed MRI data can be the undersampled MRI data, an image with random values or a blank image with zero values.

In a possible implementation form of the apparatus, during training, MRI data optimization and discriminator optimization are performed in an alternative fashion.

In a possible implementation form of the apparatus, during inference, the trained discriminator is fixed. There are no parameter updates.

In a possible implementation form of the apparatus, during inference, the initial reconstructed MRI data is optimized such that the distance for data fidelity (data consistency) is minimized and the probability from the discriminator is maximized. The fully sampled MRI data is the class with large probability, In a possible implementation form of the apparatus, during inference, the initial reconstructed MRI data can be undersampled MRI data, an image with random values or a blank image with zero values. "Initial" here means it is a starting point for the MRI data optimization algorithm. In one embodiment, the initial reconstructed MRI data can be an output from some other reconstruction algorithm. For example, some reconstruction algorithms are very fast, but the quality of the reconstructed MRI data is not very good. The output from such an algorithm can be used as the initial starting point and fed into the algorithm of the disclosed embodiments. In this manner, the algorithm of the disclosed embodiments can perform the MRI data optimization starting from reasonably good MRI data, which can save or reduce reconstruction time.

According to a second aspect, the above and further objects and advantages are obtained by a method. In one embodiment, the method includes accessing a training set of MRI data and reconstructed MRI data; building a discriminative model using the training set of MRI data, training the discriminative model to distinguish between fully sampled MRI data and reconstructed MRI data; and deploying the discriminative model to classify reconstructed MRI data from undersampled MRI data optimized by an MRI data optimization model as the reconstructed MRI image.

In a possible implementation form of the apparatus, the MRI data optimization model is configured to optimize undersampled MRI data to generate the reconstructed MRI image or fully sampled MRI data.

In a possible implementation form of the method, the training set of MRI data includes paired fully sampled MRI data or unpaired MRI data.

In a possible implementation form of the method, the undersampled MRI data is received from an MRI apparatus. The parameters of the undersampled MRI data are optimized and the reconstructed MRI data is generated. The reconstructed MRI data is then fed to the discriminator for classification.

In a possible implementation form of the method, during training, fully sampled MRI data and reconstructed MRI data will be fed into the discriminator. The discriminator will classify the inputted MRI data as reconstructed MRI data or fully sampled MRI data.

In a possible implementation form of the method, during training, fully sampled MRI data and reconstructed MRI data will be fed into the discriminator. The discriminator will be optimized to accurately classify the fully sampled MRI data and reconstructed MRI data. The fully sampled MRI data is defined as the class with the large probability and the reconstructed MRI data as the class with the small probability.

In a possible implementation form of the method, during training, the undersampled MRI data will be directly optimized in order to fool the discriminator such that the reconstructed MRI data cannot be classified or distinguished from the fully sampled MRI data by the discriminator.

In a possible implementation form of the method, the undersampled MRI data is directly optimized by changing values in the undersampled image or k-space.

In a possible implementation form of the method, during training, the discriminator will learn the prior distribution of the fully sampled MRI data and provide guidance for MRI data domain optimization. After training, the reconstructed MRI data cannot be distinguished from the fully sampled MRI data by the discriminator. In this manner, the reconstructed MRI data is in the distribution of the fully sampled MRI data.

In a possible implementation form of the method, during training, the data fidelity or consistency can be enforced by minimizing the distance between the reconstructed MRI data with some measurement operation and the observed k-space. The distance can be defined as L2, L1 or some other distance metric.

In a possible implementation form of the method, during training, the fully sampled MRI data is paired with undersampled MRI data.

In a possible implementation form of the method, during training the fully sampled MRI data is not paired with the undersampled MRI data. The model can be trained in a semi-supervised fashion.

In a possible implementation form of the method, DICOM images are used to train the discriminator.

In a possible implementation form of the method, during training, the initial reconstructed MRI data can be undersampled MRI data, MRI data with random values or a blank image with zero values.

In a possible implementation form of the method, during training, MRI data optimization and discriminator optimization are performed in an alternative fashion.

In a possible implementation form of the method, during inference, the trained discriminator is fixed. There are no parameter updates.

In a possible implementation form of the method, during inference, the initial reconstructed MRI data is optimized such that the distance for data fidelity (data consistency) is minimized and the probability from the discriminator is maximized. The fully sampled MRI data is the class with large probability.

In a possible implementation form of the method, during inference, the initial reconstructed MRI data can be undersampled MRI data, MRI data with random values or a blank image with zero values.

According to a third aspect the above and further objects and advantages are obtained by an apparatus. The apparatus is configured to provide reconstructed MRI data from undersampled MRI data. The apparatus accesses a training set of MRI data. The training set of MRI data includes paired fully sampled MRI data or unpaired DICOM images. The apparatus is configured to build a discriminative model using the training set and train the discriminative model so that it can classify MRI data reconstructed from undersampled MRI data as real or fake. The undersampled MRI data is optimized in MRI data optimization model prior to analysis by the trained discriminator. The discriminative model can be one neural network and the MRI data optimization model can be another neural network in a machine learning system.

According to a fourth aspect, the disclosed embodiments are directed to an apparatus for providing reconstructed MRI data from undersampled MRI data. The apparatus comprises a processor and a memory storing executable instructions that in response to execution by the processor, causes the apparatus to at least perform the method of any of the preceding exemplary implementations, or any combination of any preceding exemplary implementations.

According to a fifth aspect the above and further objectives and advantages are obtained by a computer program product. In one embodiment, the computer program product includes a non-transitory computer readable media or medium having stored thereon program instructions or computer readable program code that when executed by a processor causes an apparatus to at least perform the method according to any one of the possible implementation forms recited herein or any combinations thereof.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the following detailed portion of the present disclosure, the invention will be explained in more detail with reference to the example embodiments shown in the drawings, in which.

DETAILED DESCRIPTION OF THE DISCLOSED EMBODIMENTS

Figure 1:
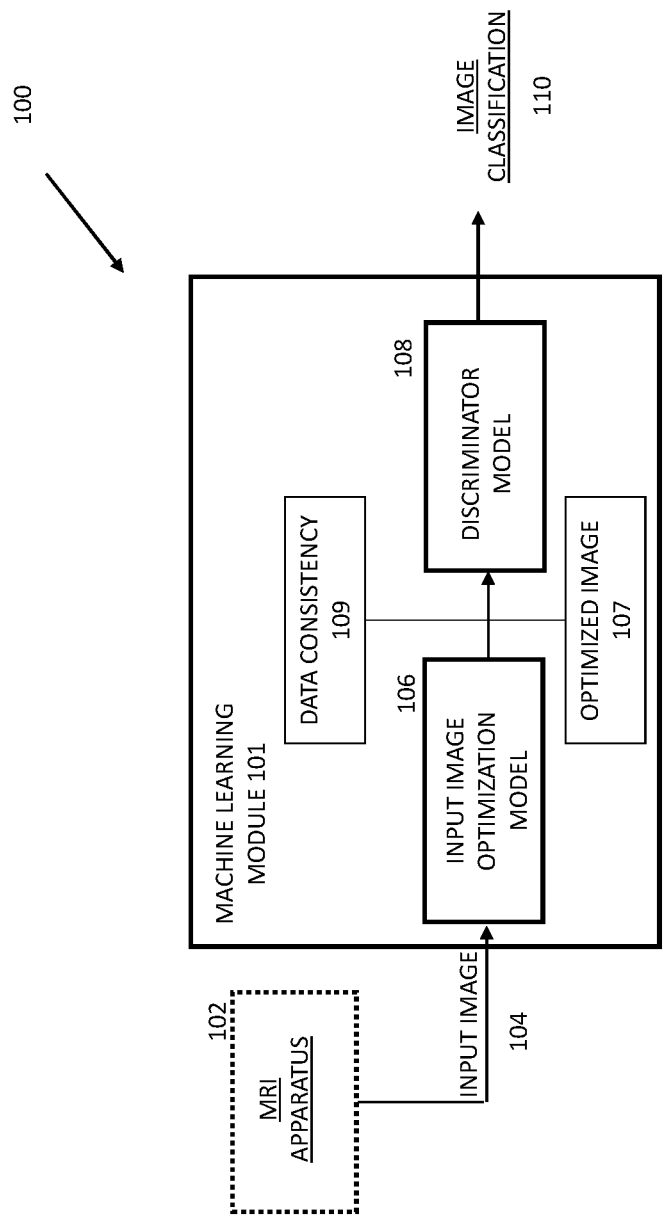
FIG. 1 illustrates an exemplary apparatus for MRI image reconstruction incorporating aspects of the disclosed embodiments and combinations thereof.

Referring to FIG. 1, a schematic block diagram of an exemplary system or apparatus 100 incorporating aspects of the disclosed embodiments is illustrated. The apparatus 100 of FIG. 1, which may also be referred to as a device, is generally configured to generate a reconstructed magnetic resonance image (MRI) data 110 from undersampled MRI input data 104. The term "undersampled" as used herein generally refers to partially acquired k-space data for an MRI image. The apparatus 100 of the disclosed embodiments is configured to optimize the reconstructed MRI data 110 to represent fully sampled data. The apparatus 100 generally comprises a deep learning framework that is configured to optimize the parameters of the undersampled input MRI data 104 directly while also maintaining data consistency.

Figure 5:
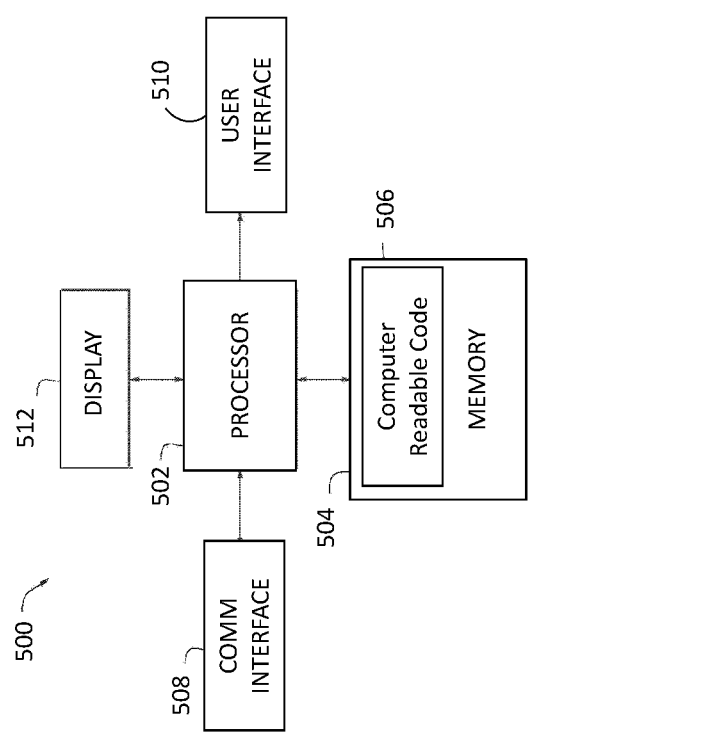
FIG. 5 illustrates an exemplary apparatus incorporating aspects of the disclosed embodiments and combinations thereof.

In one embodiment, also with reference to FIG. 5, the apparatus 100 can include at least one processor 502 and a memory 504. The processor 502 is configured to execute machine readable instructions that will cause the processor 502 to access a training set of MRI data. In one embodiment, the training set of MRI data is fully sampled MRI data. The apparatus 100 will build a discriminative or discriminator model 108 using the training set of image data. The discriminator model 108 will be configured to distinguish between fully sampled MRI data and optimized MRI data. During inference, the discriminator model 108 will be used to classify reconstructed or optimized MRI data 107 from the output of a MRI data optimization model 106, also referred to herein as an image optimization model. Although "image optimization" and "MRI data optimization" are generally referred to herein, the aspects of the disclosed embodiments are not so limited. The optimization as is described herein can be in the image domain or in the k-space domain.

The aspects of the disclosed embodiments are configured to update the reconstructed MRI data 107 and train the discriminator model 108 such that the reconstructed MRI data 107 is not distinguishable from the fully sampled MRI data. There are two classes in this classification task, the reconstructed MRI data class and the fully sampled MRI data class. If the discriminator model 108 correctly classifies the reconstructed MRI data 107 as "reconstructed MRI data", this indicates that the updated or reconstructed MRI data 107 is not good enough and needs to be improved. If the discriminator model 108 incorrectly classifies the reconstructed MRI data 107 as "fully sampled MRI data", which is the desired result, this indicates that the reconstructed MRI data 107 has been sufficiently optimized to represent fully sampled MRI data. The aspects of the disclosed embodiments are configured to cause the apparatus 100 to generate reconstructed MRI data 107 that the discriminator model 108 will classify the reconstructed MRI data as "fully sampled MRI data" or a "fully sampled image."

As illustrated in FIG. 1, in one embodiment, the apparatus 100 is configured to receive input MRI data or image data 104 from a domain such as a radiology imaging device 102. For the purposes of the examples herein, the radiology imaging device 102 will be referred to as an MRI apparatus or device, as is generally understood.

In the example of FIG. 1, the MRI data 104 from the MRI apparatus 102 is undersampled MRI data, or undersampled image data. The undersampled MRI data generally represents k-space data obtained by random sampling during an MRI data acquisition process.

The MRI data can be in two formats, image and k-space. The aspects of the disclosed embodiments can be extended to k-space and the optimization can be in the image domain and in the k-space domain. For example, the k-space can be optimized and/or the discriminator can classify if the k-space is a subsampled or fully sampled k-space.

In an alternate embodiment, the input MRI data 104 can be an output from another image reconstruction algorithm. For example, some reconstruction algorithms are very fast, but the quality of the reconstructed MRI data and images is not very good. The output from such an algorithm can be used as the initial starting point, or the initial input MRI data 104, and fed into the machine learning apparatus 100 of the disclosed embodiments. In this manner, the apparatus 100 and algorithm of the disclosed embodiments can perform the MRI data optimization starting from reasonably good input MRI data 104, which can save or reduce reconstruction time.

Currently, there are two types of algorithms for MRI data reconstruction, one type for optimizing the model parameters and one type of optimizing the image itself. From an optimization perspective, if the optimization space is very large, it is often difficult to find the optimal value since the searching space is too large. The optimization space refers to, for example, the number of parameters in a model or the number of pixel values in an image, that need to be optimized. The aspects of the disclosed embodiments are configured to change the values in the image or the k-space. The number of parameters in a model could be less than the number of pixel values in an image, which would mean that optimizing the model parameters can be easier relative to optimizing the image. However, since deep learning models often have hundreds of millions of parameters, optimizing the deep learning model can be a more difficult task in terms of time and resources.

One disadvantage of the model parameter optimization approach is that the model can put a constraint on the output, since the output generated by the model depends on the model structure and parameters. The model cannot generate certain images due to such constraints. In other words, there is a trade-off between model flexibility in terms of how many different images it can generate and the searching space. If the model is too flexible it can be more difficult to optimize.

In one embodiment, the input MRI data 104 is optimized directly using the discriminator model 108 as the guidance. This is unlike other optimization models, which update the parameters of the optimization model. By optimizing the input MRI data 104 directly, there is greater flexibility. For example, every pixel value of the input image 104 can be changed and any image can be generated. By using the discriminator model 108 as the guidance to classify the optimized MRI data 107, the input MRI data optimization should become relatively easier, in terms of time and resources.

In one embodiment, an optimization algorithm or model 106 can be used to change the values of the input image 104 directly. For example, the values of the input MRI data 104 include values or parameters that can be optimized. The optimization model is configured to update the values in the input MRI data 104. In one embodiment, the optimization model or algorithm can comprise a gradient descent optimization algorithm, which will be used to update the parameters of the input MRI data 104. In alternate embodiments, any suitable optimization algorithm can be used to update or optimize the parameters of the input MRI data 104, other than including gradient descent. After certain iterations of optimization, the input MRI data 104 becomes the optimized MRI data or image 107, also referred to as the reconstructed MRI data or image 107.

Figure 2:
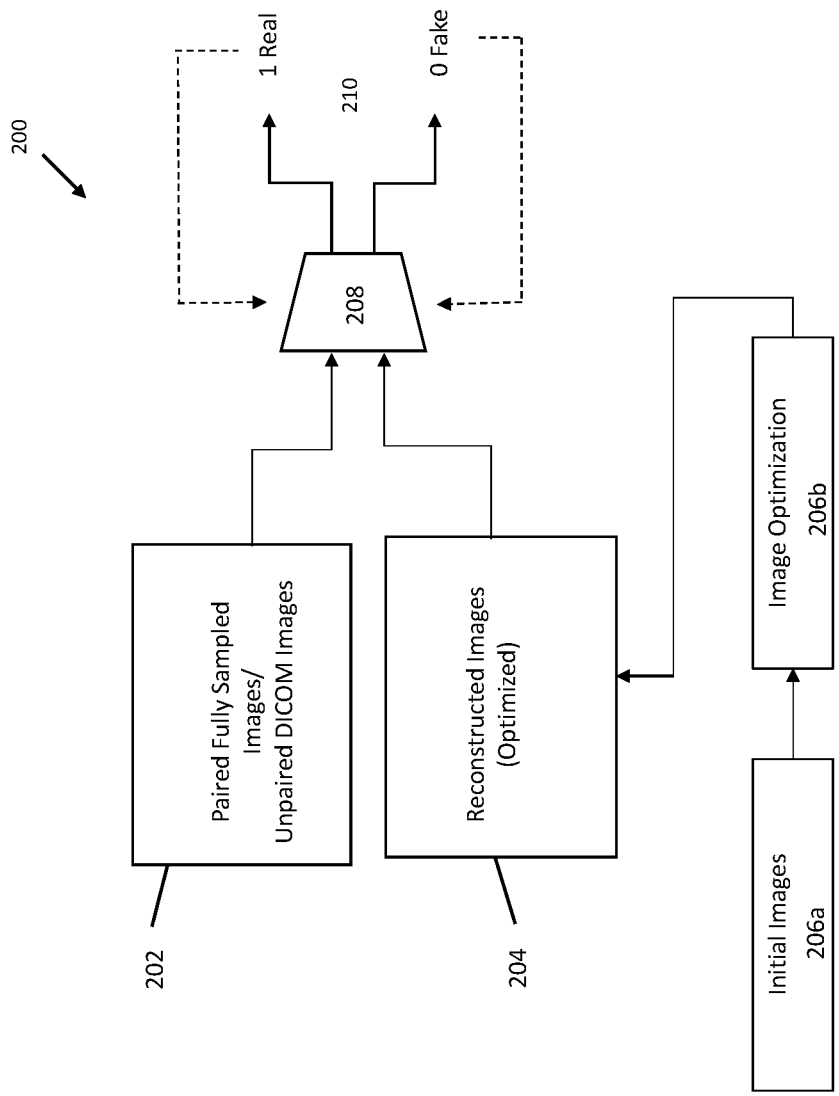
FIG. 2 illustrates an exemplary discriminator model training network incorporating aspects of the disclosed embodiments and combinations thereof.

FIG. 2 illustrates an example of a neural network 200 for training a discriminative model 208, according to various example implementations. The neural network 200 may be built and trained by the machine learning module 101 of FIG. 1. At the beginning of the training process, the network 200 may generate reconstructed MRI data 204 based on one or more random inputs 206a from a known probability distribution such as a uniform distribution or a Gaussian distribution. In one embodiment, the discriminative model 208 may alternatively receive a sample of paired or unpaired fully sampled MRI data 202 and a sample of reconstructed or optimized MRI data 204 from the MRI data optimization module 206b through a switching component (not shown).

In one embodiment, the training set 202 of fully sampled MRI data may be generated from a data distribution of interest. For example, if we know that the MRI data or image X to be retrieved is a heart image, the fully sampled MRI data 202 can only include heart MRI data or images. After receiving a sample, the discriminative model 208 may determine whether the sample is a sample of a fully sampled MRI data 202 or reconstructed MRI data 204.

Figure 3:
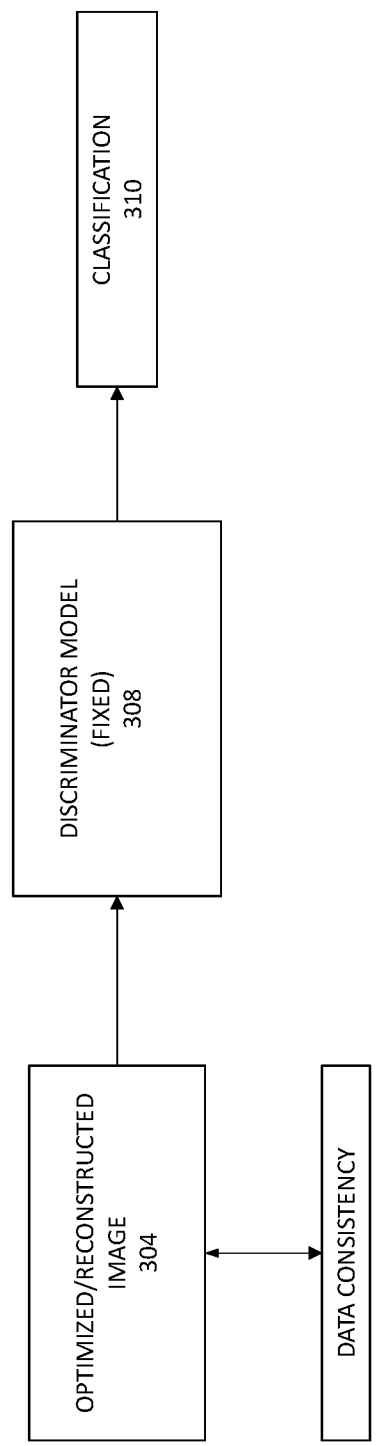
FIG. 3 illustrates an exemplary trained discriminator incorporating aspects of the disclosed embodiments and combinations thereof.

During inference, referring to FIG. 3, the values or parameters of the discriminator model 308, which can also be referred to with respect to the example of FIG. 1 as a "trained discriminator", are fixed. There are no further updates to the parameters of the discriminator model 308. Additionally, the input MRI data 304 in this example is optimized such that the distance for data fidelity is maintained and the probability from the discriminator model 308 is maximized.

For example, in one embodiment, during training, referring to FIG. 2, data fidelity or data consistency can be enforced by minimizing the distance between the reconstructed MRI data 204 with a same measurement operation and observed k-space. The distance can be defined as L2, L1 or other distance metric. As noted earlier, the fully sampled MRI data is defined as the class with the largest probability. The discriminator model 208 in this example will be optimized to accurately classify the fully sampled MRI data and reconstructed MRI data. The fully sampled MRI data 202 is defined as the class with the large probability and the reconstructed MRI data 204 as the class with the small probability.

For example, if the fully sampled MRI data is defined as the positive class and reconstructed MRI data as the negative class, the large probability from the discriminator indicates the MRI data is highly likely to be fully sampled MRI data. A small probability indicates that the MRI data is not likely to be fully sampled MRI data, but is highly likely to be reconstructed MRI data.

Referring again to FIG. 2, the regularization component of the optimization model can be fulfilled by the discriminator model 208 of the neural network 200. The discriminator model 208 in this example is configured to classify if the reconstructed MRI data 204 is fully sampled MRI data or undersampled MRI data.

For example, during training of the discriminator model 208, training data of a training set 202 will be fed to the discriminator model 208. In one embodiment, the training set 202 can include paired fully sampled MRI data. The discriminator model 208 will also receive reconstructed MRI data 204. In this example, the reconstructed MRI data 204 is the initial MRI data 206a. The initial MRI data 206a is optimized with an MRI data optimization algorithm or model 206b.

In one embodiment, the initial MRI data 206a can comprise undersampled MRI data, MRI data with random values or blank images with zero values. Since the image size is known, a data matrix can be created with the same size. The data matrix can be filled with zeros or random values.

In the example of FIG. 2, the discriminator model 208 will be trained or optimized to accurately classify the fully sampled MRI data 204 and the reconstructed MRI data 206. During training, the undersampled input MRI data 206a will be directly optimized as illustrated and described with respect to FIG. 1 so that the discriminator model 208 of FIG. 2 cannot distinguish or classify the reconstructed MRI data 204 from the fully sampled MRI data 202.

In one embodiment, during training, the discriminator model 208 will learn the prior distribution of the fully sampled MRI data 202 and will provide guidance for the MRI data domain optimization of the input MRI data 206a by the MRI data optimization model 206b. In this manner, after training, the reconstructed or optimized MRI data 107 of FIG. 1 cannot be distinguished from the fully sampled MRI data by the discriminator model 108. It is desired that the MRI data in the form of two images or k-space have the same or at least similar distribution. The overall distribution, rather than a part of the distribution, should be similar.

As is illustrated in FIG. 2, during training, the fully sampled MRI data 202 does not need to be paired with the undersampled MRI data 204. The discriminator model 208 in this example can be trained using paired data or unpaired data. Paired data, as is generally understood, includes both undersampled data and fully sampled data from the same subjects. Unpaired data, as is generally understood, can include both undersampled data and fully sampled data, but from different subjects.

For example, in one embodiment, referring to FIG. 2, unpaired data in the training data set 202 can include Digital Imaging and Communications in Medicine (DICOM) images or DICOM image data. In the medical field it can be difficult to obtain paired fully sampled MRI data, also referred to as ground truth data. However, there is an availability of large amounts of DICOM images, which can be fully sampled images or reconstructed images. The DICOM images in the training set 202 do not need to be paired with the undersampled data 206a in the example of FIG. 2. This unpaired data can be used for training the discriminator model 208 shown in FIG. 2, which will be used as the trained discriminator model 108, 308 of FIGS. 1 and 3, respectively.

While DICOM image data is referred to herein, the aspects of the disclosed embodiments are not so limited. In alternate embodiments, the source of MRI and image data for training can be any suitable source and can include MRI data in any suitable format. Thus, at least the unpaired data and fully sampled MRI data can be MRI data from a source and in a format, other than including DICOM.

By using unpaired data, the discriminator or discriminative model 208 illustrated in FIG. 2 can be trained in a semi-supervised fashion. The training of the discriminator model 208 shown in FIG. 2 is similar to training a discriminator during regular generative adversarial network (GAN) training. However, the loss function during the training of the discriminator model 208 according to the disclosed embodiments will be different.

For example, when using unpaired data for training of the discriminator model 208 of FIG. 2, fully sampled MRI data of the training data set 202 in FIG. 2 is not the pair of the reconstructed MRI data 204. However, the distribution of the optimized MRI data 204 can be enforced to be close to the distribution of the fully sampled MRI data 202. It is desired to optimize the input MRI data 104 and during optimization, the distribution of input MRI data 104 will change. The final distribution of the reconstructed MRI data 204 should be close to the distribution of the fully sampled MRI data from the training data set 202.

In one embodiment, this can be achieved by, for example, "optimal transport theory", often called the Wasserstein distance or metric, which was first proposed in Wasserstein GAN (WGAN). This distance is to measure the similarity of two distributions, where a "distribution" refers to a group of images. The Wasserstein distance measures the similarity between two groups of images and is a mathematic distance function defined between probability distributions on a given metric space, to measure a difference between the distribution of the image data in the training set and the corresponding distribution of the optimized image data, until a Nash equilibrium is reached. Using the Wasserstein distance to train the discriminative model 208 of FIG. 2 can improve the speed of convergence to Nash equilibrium and the robustness of the machine learning network 101 illustrated in FIG. 1.

In one embodiment, referring also to FIG. 2, during training, the optimization of the input MRI data 104 by the MRI data optimization model 206b and the optimization of the discriminator model 208 can be performed in an alternative manner. For example, in one embodiment, the discriminator model 208 can be trained for a few iterations. Then, the input MRI data optimization model 206b can be optimized for a few iterations. The training of the discriminator model 208 and the optimization of the input MRI data 104 by the input MRI data optimization model 206b of FIG. 2 can be repeated until the loss value is minimized, meaning the reconstructed MRI data 204 is good, or not distinguishable from the fully sampled MRI data 202. As such, the discriminator model 208 will classify 210 the reconstructed MRI data 204 as real, rather than fake. Once trained, the discriminator model 208 will be implemented in inference, as illustrated in FIGS. 1 and 3, referring to the trained discriminator models 108 and 308.

The aspects of the disclosed embodiments are configured to provide data consistency between the reconstructed data and the observed data. The observed data for purposes of the description herein is the partially sampled k-space data. The reconstructed k-space data needs to be as close as possible to the observed k-space at those sampling locations.

Data consistency can be implemented in several ways. In one embodiment, a loss function can be added during training to make sure the reconstructed k-space data is consistent with the observed data. The data consistency can also be enforced as part of the network structure.

In this embodiment, referring to FIG. 1, a "data consistency layer" or module 109 is added into the machine learning module or network 100 of the apparatus 10. The data consistency layer 109 replaces the reconstructed results from the previous layer with the observed data. After the replacement, the reconstructed results are consistent with the observed data.

With reference to FIG. 3, during inference, the parameters of the trained discriminator model 308 are fixed. There are no parameter updates to the trained discriminator 308. The initial reconstructed MRI data 304 of FIG. 3 is optimized such that the distance for data fidelity is minimized and the probability from the discriminator model 308 is maximized, since the fully sampled MRI data is defined as the class with the large probability.

Figure 4:
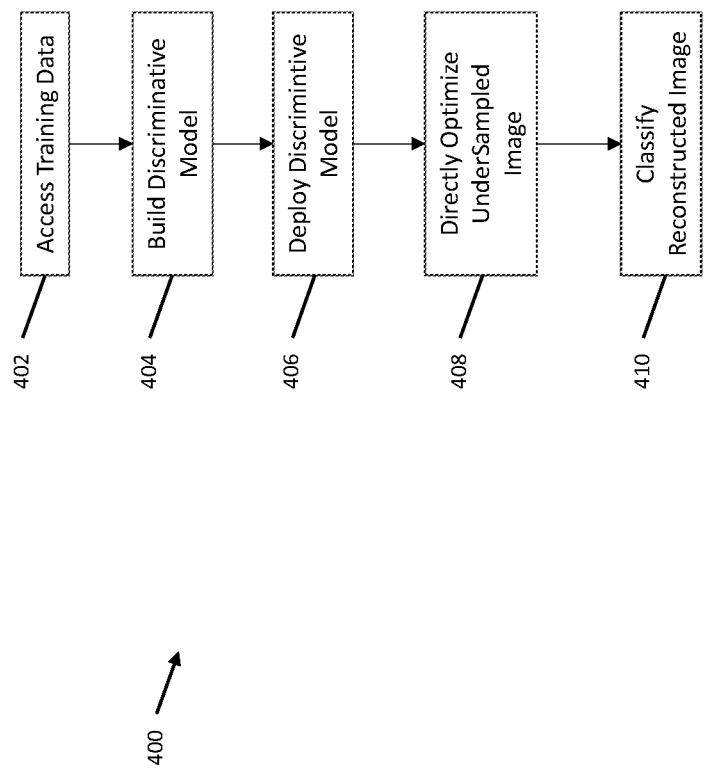
FIG. 4 is an exemplary flowchart illustrating MRI data reconstruction process flow incorporating aspects of the disclosed embodiments and combinations thereof.

FIG. 4 is a flowchart illustrating various operations in a method 400 of generating reconstructed MRI data from undersampled MRI data. As shown at block 402, the method includes accessing training data. In this example, the training data can include fully sampled MRI data of a training set of MRI data, such as the training set 202 referred to in FIG. 2. In one embodiment, the training set includes one or more paired fully sampled MRI data or DICOM images. The training data in this example will also include reconstructed MRI data, such as the reconstructed MRI data 204 of FIG. 2. The reconstructed MRI data generally comprises undersampled MRI data that is optimized or updated using a MRI data optimization algorithm, such as that illustrated and described with respect to FIG. 2.

At block 404, a discriminator model is built from the training data set. The discriminator model in this example, such as the discriminator model 208 of FIG. 2, is trained and configured to classify the reconstructed MRI data as fully sampled MRI data or undersampled MRI data.

At block 406 the trained discriminator model is deployed to be used during inference. Examples are illustrated with respect to FIG. 1 and FIG. 3.

At block 408, during inference, undersampled image, or k-space data that is partially obtained during sampling is received from an MRI apparatus. The undersampled MRI data is optimized using an MRI data optimization model, as is shown for example in FIGS. 1 and 3. The reconstructed MRI data is optimized such that the distance for data fidelity (data consistency) is minimized and the probability from the discriminator is maximized.

At block 410, the discriminator classifies whether the optimized MRI data is reconstructed MRI data or fully sampled MRI data.

According to example implementations of the present disclosure, the apparatus 100 and its subsystems including the machine learning module 101, MRI data optimization module 106 and the trained discriminator model 108 may be implemented by various means. Means for implementing the apparatus 100 and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

FIG. 5 illustrates an apparatus 500 that can be used to implement aspects of the disclosed embodiments or combinations thereof. Generally, the apparatus 500 of the exemplary implementations may comprise, include or be embodied in one or more fixed or portable electronic devices. Examples of suitable electronic devices include a smartphone, tablet computer, laptop computer, desktop computer, workstation computer, server computer or the like. The apparatus 500 may include one or more of each of a number of components such as, for example, processor or processing circuitry 502 connected to a memory or storage device 504. In some examples, the apparatus 500 implements the apparatus 100, or components thereof, of FIG. 1.

The processor 502 may be composed of one or more processors alone or in combination with one or more memories 504. The processor 502 is generally any computer hardware that is configured to process information such as, for example, data, computer programs and/or other suitable electronic information. The processor 502 can be comprised of a collection of electronic circuits some of which may be packaged as an integrated circuit or multiple interconnected integrated circuits, also referred to as a chip. The processor 502 may be configured to execute computer program or other machine readable instructions, which may be stored onboard the processor or otherwise stored in the memory 504.

The processor 502 may be a number of processors, a multi-core processor or some other type of processor, depending on the particular implementation. Further, the processor 502 may be implemented using a number of processor systems in which a main processor is present with one or more secondary processors on a single chip. As another illustrative example, the processor 502 may be a symmetric multi-processor system containing multiple processors of the same type. In yet another example, the processor 502 may be embodied as or otherwise include one or more application-specific integrated circuits (ASICs), field-programmable gate arrays (FPGAs) or the like. Thus, although the processor 502 may be capable of executing a computer program to perform one or more functions, the processor 502 may be capable of performing one or more functions without the aid of a computer program. In either instance, the processor 502 may be appropriately programmed to perform functions or operations according to aspects of the disclosed embodiments.

The memory 504 is generally any piece of computer hardware that is capable of storing information such as, for example, data, computer programs, computer-readable program code 506 and/or other suitable information either on a temporary basis and/or on a permanent basis. The memory 504 may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like.

In various instances, the memory 504 may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 504, the processor 502 may also be connected to one or more interfaces for displaying, transmitting and/or receiving information. The interfaces may include, but are not limited to, a communications interface 508, a user interface 510, and a display 512.

Although the user interface 510 and display 512 are shown as separate components, the aspects of the disclosed embodiments are not so limited. In one embodiment, the user interface 510 and display 512 can comprise a single device.

The communications interface 508 may be configured to transmit and/or receive information, such as to and/or from other apparatus(es), network(s) or the like. The communications interface 508 may be configured to transmit and/or receive information by physical (wired) and/or wireless communications links. Examples of suitable communication interfaces 508 include a network interface controller (NIC), wireless NIC (WNIC) or the like.

The user interface 510 may include one or more user input devices. The display 512 may be configured to present or otherwise display information to a user, suitable examples of which include a liquid crystal display (LCD), light-emitting diode display (LED), plasma display panel (PDP) or the like. The user input interface 510 and display 512 may be wired or wireless, and may be configured to receive information from a user into the apparatus, such as for processing, storage and/or display. Suitable examples of user input interfaces 510 include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions 506 may be stored in memory 504, and executed by processor 502 that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Thus, while there have been shown, described and pointed out, fundamental novel features of the invention as applied to the exemplary embodiments thereof, it will be understood that various omissions, substitutions and changes in the form and details of devices and methods illustrated, and in their operation, may be made by those skilled in the art without departing from the spirit and scope of the presently disclosed invention. Further, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An apparatus for reconstructing a magnetic resonance imaging (MRI) image, the apparatus comprising a processor and a memory storing executable instructions, that in response to execution by the processor, cause the apparatus to:
   access a training set of MRI data;
   build a discriminator model using the training set of MRI data, the discriminator model being trained to distinguish between fully sampled MRI data and MRI data that comprises undersampled MRI data or reconstructed MRI data that is not fully sampled MRI data;
   during inference, use the discriminator model to classify MRI data from an output of an MRI data optimization model as fully sampled MRI data; and
   if the discriminator model classifies the MRI data as fully sampled MRI data, generate a reconstructed MRI image from the fully sampled MRI data; or
   if the discriminator model does not classify the MRI data from MRI data optimization model as fully sampled MRI data, continue processing the MRI data with the MRI data optimization model until the discriminator model classifies the MRI data as fully sampled MRI data.

2. The apparatus according to claim 1, wherein the MRI data optimization model is configured to optimize the undersampled MRI data or the reconstructed MRI data that is not fully sampled MRI data until the discriminator classifies the MRI data as fully sampled MRI data to generate the reconstructed MRI image.

3. The apparatus according to claim 1 wherein the training set of MRI data comprises paired MRI data or unpaired MRI data.

4. The apparatus according to claim 1 wherein the apparatus is further configured to:
   receive undersampled MRI data or reconstructed MRI data from an MRI apparatus;
   optimize parameters of the undersampled MRI data or reconstructed MRI data using the MRI data optimization model until the discriminator classifies the output of the MRI data optimization model as fully sampled image data; and
   generate the reconstructed MRI image from the output of the MRI data optimization model when the discriminator classifies the output of the MRI data optimization model as fully sampled MRI data.

5. The apparatus according to claim 4, wherein the undersampled MRI data is directly optimized.

6. The apparatus according to claim 5, wherein the undersampled MRI data is directly optimized by changing values in image data or k-space using a neural network.

7. The apparatus according to claim 1, wherein during training the discriminator model and the MRI data optimization model are trained alternatively.

8. The apparatus according to claim 1 wherein the MRI data comprises MRI images or MRI k-space data.

9. The apparatus according to claim 1, wherein during inference, parameters of the discriminator model are fixed.

10. A method for reconstructing a magnetic resonance imaging (MRI) image, the method comprising:
    using a hardware processor to access a training set of MRI data;
    using a hardware processor to build a discriminator model using the training set of MRI data, the discriminative model being trained to distinguish between fully sampled MRI data and MRI data that comprises undersampled MRI data or reconstructed MRI data that is not fully sampled MRI data;

during inference, use the discriminator model to classify MRI data from an output of an MRI data optimization model as fully sampled MRI data; and if the discriminator model classifies the MRI data from the MRI data optimization model as fully sampled MRI data, generate a reconstructed MRI image from the MRI data; or if the discriminator model does not classify the MRI data from the MRI data optimization model as fully sampled MRI data, continue processing the MRI data with the MRI data optimization model until the discriminator model classifies the MRI data as fully sampled MRI data.

11. The method according to claim 10, further comprising using the MRI data optimization model to optimize the undersampled MRI data or the reconstructed MRI data that is not fully sampled MRI data until the discriminator classifies the MRI data as fully sampled MRI data to generate the reconstructed MRI image.

12. The method according to claim 10 wherein the training set of MRI data comprises paired MRI data or unpaired MRI data.

13. The method according to claim 10, the method further comprising:

receiving undersampled MRI data or reconstructed MRI data from an MRI apparatus;

optimizing parameters of the undersampled MRI data or reconstructed MRI data using the MRI data optimization model until the discriminator classifies the output of the MRI data optimization model as fully sampled image data; and generating the reconstructed MRI image from the output of the MRI data optimization model when the discriminator classifies the output of the MRI data optimization model as fully sampled MRI data.

14. The method according to claim 13, wherein the undersampled MRI data is directly optimized.

15. The method according to claim 14, wherein the undersampled MRI data is directly optimized by changing values in image data or k-space using a neural network.

16. The method according to claim 10, wherein during training the discriminator model and the MRI data optimization model are trained alternatively.

17. The method according to claim 10 wherein the MRI data comprises MRI images or MRI k-space data.

18. The method according to claim 10, the method further comprising fixing parameters of the discriminator model during inference.

19. The method according to claim 10, the method further comprising using undersampled MRI data, MRI data with random values or a blank image with zero values as initial MRI data for the MRI data optimization model.

20. A computer program product comprising non-transitory machine readable instruction, which when executed are configured to carry out the method according to claim 10.

* * * * *